(12) United States Patent
Bula et al.

(10) Patent No.: US 6,373,975 B1
(45) Date of Patent: Apr. 16, 2002

(54) ERROR CHECKING OF SIMULATED PRINTED IMAGES WITH PROCESS WINDOW EFFECTS INCLUDED

(75) Inventors: Orest Bula, Shelburne; Daniel C. Cole, Jericho; Edward W. Conrad, Jeffersonville; William C. Leipold, Enosburg Falls, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/237,148

(22) Filed: Jan. 25, 1999

(51) Int. Cl.⁷ .................................................. G06K 9/00
(52) U.S. Cl. ........................................ 382/144; 382/145
(58) Field of Search ................................ 382/144, 141, 382/142, 143, 145, 147, 152, 219, 205; 438/8, 800

(56) References Cited

U.S. PATENT DOCUMENTS

| 4,648,053 A | * | 3/1987 | Fridge ........................ 364/551 |
| 4,902,899 A | | 2/1990 | Lin et al. |
| 5,544,256 A | * | 8/1996 | Brecher et al. ............. 382/149 |
| 5,631,110 A | | 5/1997 | Shioiri et al. |
| 5,640,200 A | * | 6/1997 | Michael ...................... 348/87 |
| 5,698,346 A | | 12/1997 | Sugawara |
| 5,705,301 A | | 1/1998 | Garza et al. |
| 5,707,765 A | | 1/1998 | Chen |
| 5,723,233 A | | 3/1998 | Garza et al. |
| 5,725,974 A | | 3/1998 | Kawahira |
| 5,795,688 A | | 8/1998 | Burdorf et al. |
| 5,985,497 A | * | 11/1999 | Phan et al. .................... 430/30 |

* cited by examiner

*Primary Examiner*—Andrew W. Johns
*Assistant Examiner*—Seyed Azarian
(74) *Attorney, Agent, or Firm*—McGinn & Gibb, PLLC; Richard M. Kotulak, Esq.

(57) ABSTRACT

A structure and method for checking semiconductor designs for design rule violations includes generating a predicted printed structure (i.e., an ideal image) based on the semiconductor designs, altering the ideal image to include potential manufacturing variations, thereby producing at least two production images representing different manufacturing qualities, and comparing the production images to the design rules to produce an error list.

25 Claims, 7 Drawing Sheets

ERROR CHECKING OF SIMULATED PRINTED IMAGES WITH PROCESS WINDOW EFFECTS INCLUDED

BACKGROUND OF THE INVENTION

1. Field of the Invention

The present invention generally relates to modeling of integrated circuit layouts and more particularly to an improved process for checking for design rule (e.g., spacing) violations.

2. Description of the Related Art

Conventional integrated circuit design rule checking systems check as-designed shapes against a complicated set of rules. More recently, design rule checking systems have begun to utilize commercial programs (such as those by Numerical Technologies, Inc.333 West Maude Ave., Suite 207, Sunnyvale, Calif., U.S.A.) which model many of the diffraction induced phenomena and subsequently use the modeled wafer image as the input to a design rule checker. This approach simplifies the coding of the design rule checker since the complexities of the diffraction phenomena are accounted for in the wafer image modeling program. However, such conventional approaches do not account for photolithographic or other process effects on the net process window.

As the minimum feature size in semiconductor integrated circuit technology is pushed below the wavelength of the light used to transfer the mask images to the wafers, diffraction effects introduce the need for additional complex design rules. In addition, other physical effects such as localized etch variations, mask distortions, lens distortions, and topography related effects introduce deviations between the desired and actual printed patterns on the wafer. These effects become increasingly important as the physical dimensions of the circuit elements decrease. These complexities make it difficult both to do the design layout and the design rule checking (DRC) correctly.

Figure 1A:
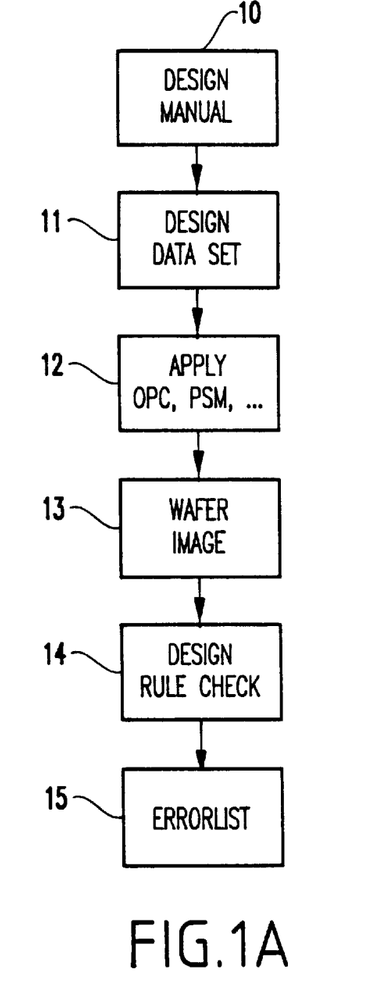
FIG. 1A is a flowchart of a design rule checking program.
Figure 1B:
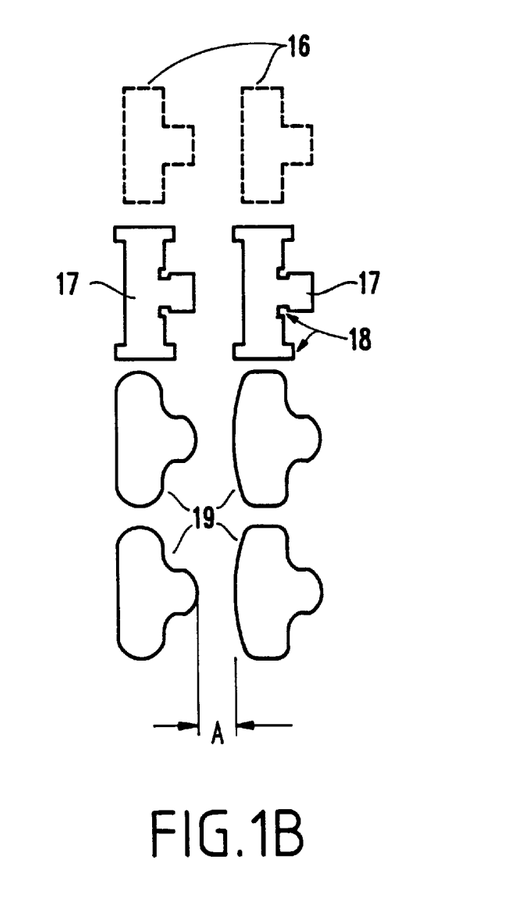
FIG. 1B illustrates schematic images produced by the design rule checking program in FIG. 1A.

FIG. 1A is a flowchart of a prior art design checking program and FIG. 1B illustrates shapes correlating to the flowchart in FIG. 1A.

Input from the design manual 10 is used to create a design data set 11 which forms the first set of shapes 16. Next, optical proximity correction and/or phase shift mask adjustment programs add notches and bars 18 or other changes to the initial set of shapes 16 to reduce the anticipated distortion which occurs during the manufacturing process to produce the shapes shown as items 17 in FIG. 1B.

A simulation program produces the wafer image 19 as shown in block 13. The simulated manufactured image 19 usually has rounded corners, and other distortions. Next a design rule check 14 is performed to determine, for example, if the space A (e.g., the space between the images 19) is within the range specified in the design rules. If the space A violates a design rule it would be flagged and identified on an errorlist 15.

The conventional approaches do not explore the effects of process variations such as focus, exposure, overlay, etc., in determining whether the shapes obey the design rules. Conventional systems utilize very complicated rule sets, have an approach limited to nominal processing quality, and do not account for real world manufacturing complications.

SUMMARY OF THE INVENTION

It is, therefore, an object of the present invention to provide a structure and method for checking semiconductor designs for design rule violations, including generating an ideal image based on the semiconductor designs, altering the ideal image to include potential manufacturing variations, thereby producing at least two production images representing different manufacturing qualities, and comparing the production images to the design rules to produce an error list.

Two of the production images represent opposite manufacturing quality extremes. The production images illustrate a continuum of the potential manufacturing variations of the ideal image.

The altering of the ideal images includes accounting for mask variations and optical variations. The production images include sets of production images, each set representing a different manufacturing variation, the checking including comparing one or more of the production images within each given set to the design rules, and comparing one or more of the sets of production images to the design rules.

The potential manufacturing variations can include focus variations, dose variations, deposition variations, etching variations or alignment variations. The design rules can check feature size, spacing, intersection area, common run lengths and overlapping.

The invention produces designs which have higher yields and lower manufacturing costs by reducing design sensitivities to known manufacturing process variations. The invention enables processes to be transferred from one tool set to another which has been suitably characterized. The invention is also applicable to any computer aided design (CAD)-based design process wherein the manufacturing process variations can be modeled and the results analyzed via a set of design rules.

Further, the invention allows the designer to explore possible advantageous process variations that fall within the design rules. For example, a process variation may produced an unexpected benefits which would not have been inherently obvious from the initial unmodified design. The invention allows an unlimited number of process variations to be explored which allows the designer the opportunity to find any such unexpected benefits.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 2A:
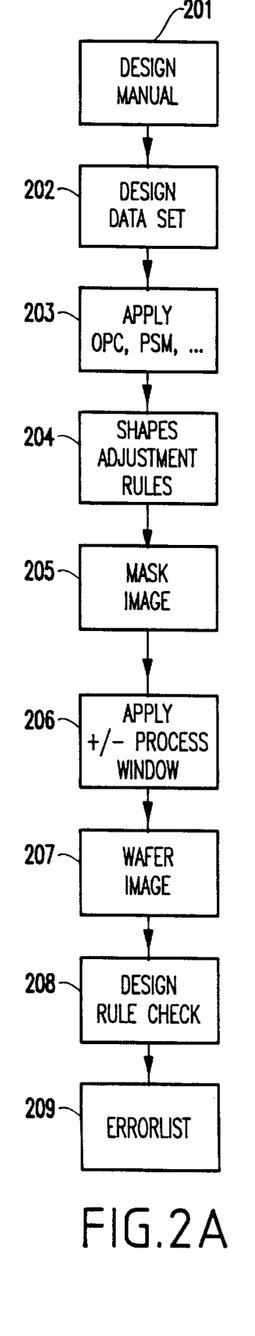
FIG. 2A is a flow chart of a design rule checking system illustrating a preferred method of the invention.
Figure 2B:
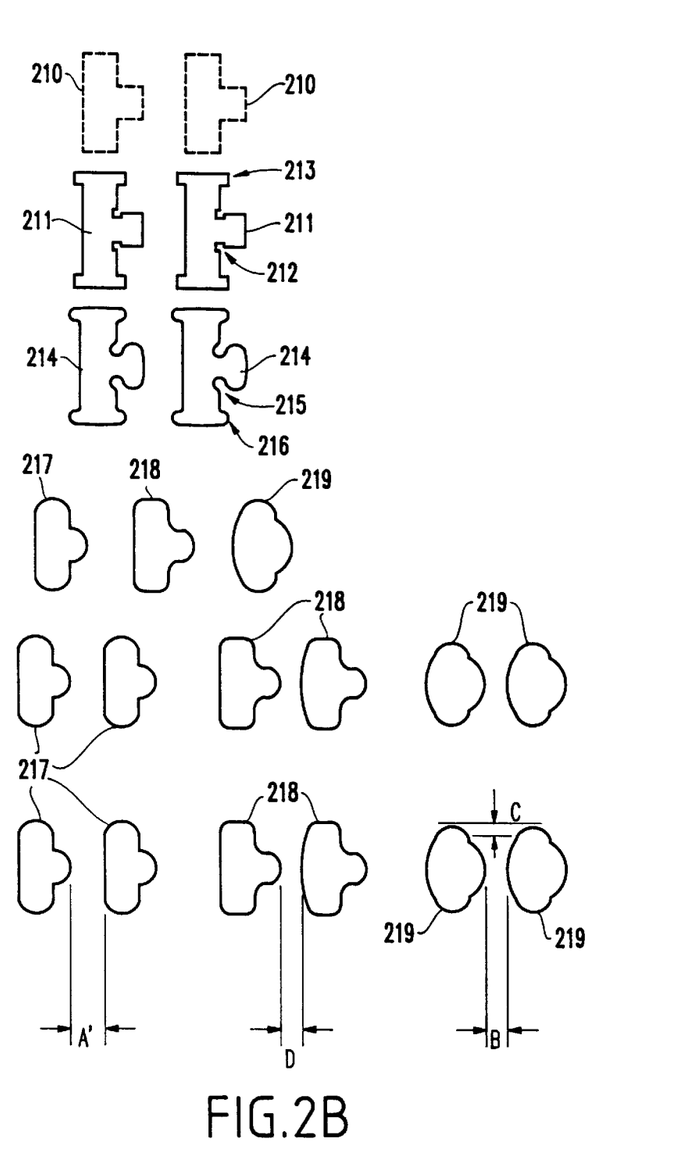
FIG. 2B illustrates schematic images produced by the design rule checking program in FIG. 2A.

Referring now to the drawings, and more particularly FIGS. 2A and 2B, a flowchart and the shapes produced by the processing in the flowchart are illustrated. As shown in FIGS. 2A and 2B, input from a design manual 201 is used to create a design data set 202 of shapes 210. Next, optical proximity correction, aberration correction, and/or phase shift mask adjustment programs are applied to the shapes 210 to counteract the anticipated distortion that occurs during manufacturing, as shown in block 203. As discussed in the background section above, internal corners are notched 212 and external corners are extended with bars 213 to reduce anticipated distortions.

However, the conventional programs which perform the optical proximity correction and/or phase shift mask adjustment account for optical effects only and assume that a perfect mask is used to transfer the image. Since such conventional optical proximity correction and/or phase shift mask adjustments do not account for mask defects, the conventional models deviate significantly from the actually manufactured item.

The invention accounts for mask defects by providing a set of shapes adjustment rules, as shown in block 204. As discussed in greater detail below with respect to FIGS. 4–6, the shapes adjustment rules round and foreshorten the notches 212 to produce rounded notches 215. Similarly, the shapes adjustment rules round and foreshorten the bars 213 to produce rounded bars 216. The shapes adjustment rules could consist of something as simple as beveling the corners of shapes or as complex as the output of an e-beam modeling tool.

The invention makes changes to the ideal image on the photomask to reflect distortions that will most likely be introduced by the mask manufacturing process, as well as other process distortions. Thus, the invention is superior to the conventional systems because the invention accommodates mask defects as well as optical effects which occur when the image is being transferred from the mask.

As shown in block 205 the model mask image is then formed using the shape 214 produced by the shapes adjustment rules. However, with the invention multiple shapes 217–219 are produced which represent different processing qualities within the possible range of processing qualities (e.g., within the processing window) in block 206.

More specifically, image 217 represents a high quality image, and could represent the highest quality extreme for a given manufacturing process. To the contrary, image 219 represents a low quality processing, and could similarly represents the lowest quality extreme for a given manufacturing process. Image 218 represents a processing which is between the high-quality and low-quality processing.

While three different processing quality images are shown in FIG. 2B, an unlimited number of images within the window of possible manufacturing qualities can be produced with the invention, depending upon the specific designers requirements.

The shape adjustment rules 204 are important to the process of properly accounting for process window 206 variations. As mentioned above, in block 206 different ranges of processing precision are determined and shapes are modeled for any number of points between the extremes (or at the extremes) of the processing spectrum in block 207.

For example, one shape 217 could represent one processing extreme (e.g., an accurately focused image) and shape 219 could represent the other process extreme (e.g., out of focus image). Additionally, different manufacturing qualities of deposition, etching and reticle alignment will similarly affect the actual manufactured shape and placement of the feature.

As shown in block 208, sets of the different processing variations are checked against the design rules. In effect, this creates multiple data sets, one for each of the processing variations generated by the processing window 206.

More specifically, in block 208, the space A' (e.g., the space between adjacent shapes 217) is measured. If the space A' violates a design rule it is flagged and noted on an errorlist. The space B (e.g., the space between adjacent shapes 219), the space D (e.g., the space between adjacent shapes 219) and the height C (e.g., the difference between the height of shapes 217–219) are measured. As before, if any space violates a design rule, it is flagged and noted on an error list. The error lists are combined to produce the error list 209 that is the output of the program.

In addition, design rules also measure image size, overlap of shapes corresponding to different layers of the design, common run lengths of adjacent shapes, extensions of one shape past another shape corresponding to a different layer, and coverage of one shape by another shape corresponding to a different layer.

Figure 3:
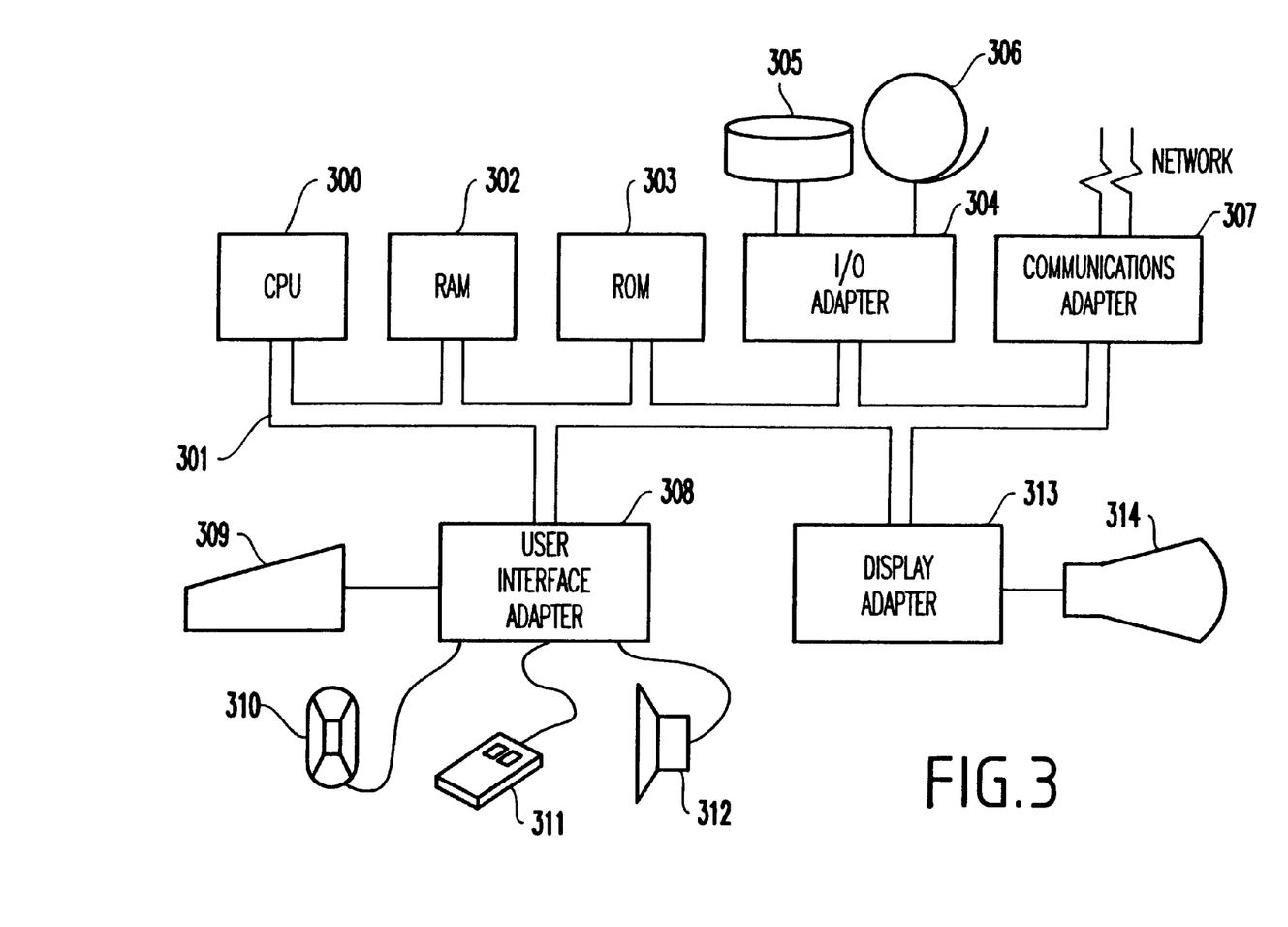
FIG. 3 is a typical hardware configuration of an information handling/computer system in accordance with the invention.

FIG. 3, illustrates a typical hardware configuration of an information handling/computer system for operating the invention. Such a system preferably has at least one processor or central processing unit (CPU) 300. The CPU 300 is interconnected via a system bus 301 to a random access memory (RAM) 302, read-only memory (ROM) 303, input/output (I/O) adapter 304 (for connecting peripheral devices such as disk units 305 and tape drives 306 to the bus 301), communication adapter 307 (for connecting an information handling system to a data processing network) user interface adapter 308 (for connecting a keyboard 309, microphone 310, mouse 311, speaker 312 and/or other user interface device to the bus 301), and display adapter 313 (for connecting the bus 301 to a display device 314).

As mentioned briefly above, the shapes adjustment rules round and foreshorten the notches 212 to produce rounded notches 215 as well as round and foreshorten the bars 213 to produce rounded bars 216. More specifically, the shapes adjustment rules first apply a symmetric bias consistent with the mask build process to the shapes. Then the corners are replaced with double bevels using empirically obtained beveling parameters. Then a reverse symmetric bias, which mimics the masking film etch bias, is applied. The resulting images closely approximate those found on actual masks. The images are then used as input to lithography modeling programs to predict the shapes of the wafer level images.

Additional details on implementing a model for characterizing the mask making process are described. While there are other ways to characterize the mask images, this approach has been found to work well. Accounting for distortions introduced by the mask making process aids significantly in the improvement of the process window.

Two additional factors need to be considered in the shapes adjustment rules. First, inside corners of mask images (corners surrounded on three sides by the masking film)

have larger radii of curvature than outside corners (corners surrounded on three sides by the absence of the masking film). The values for these radii are a function of the mask manufacturing process and are determined experimentally. Second, if the mask images are sufficiently narrow so that the circles defined by the radii of curvature of neighboring corners of the same type (inside or outside) overlap, a different correction procedure is applied. Additionally, there may be orientation dependent effects which may need to be included.

The use of a double bevel adjustment of the data set is discussed below as a preferred embodiment of this invention. However, as would be known by one ordinarily skilled in the art given this disclosure, bezier or cubic spline, parabolic or semicircular methodologies could be used to achieve a similar result.

Figure 4:
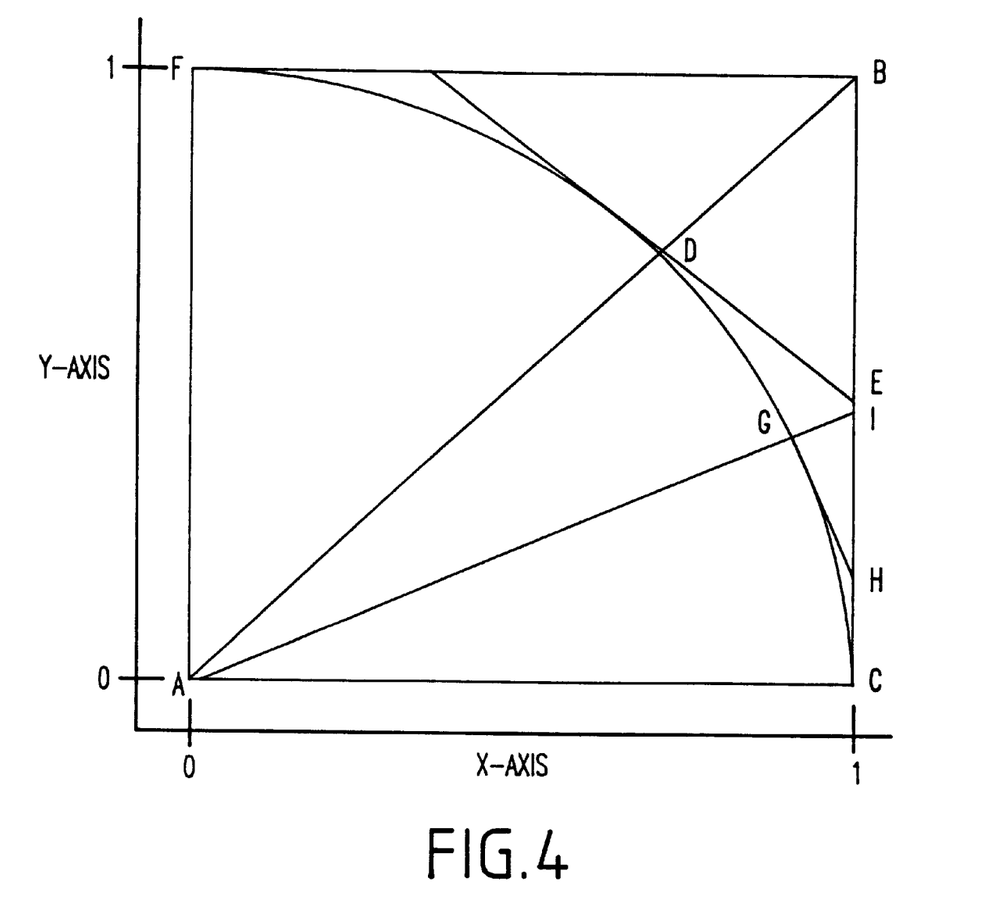
FIG. 4 is a schematic illustration of a corner with an inscribed quarter circle centered on a point.

FIG. 4 shows an example of a corner defined by $\overline{CBF}$ with an inscribed quarter circle $\overline{FDC}$ centered on point A. Lines $\overline{AF}$, $\overline{AD}$, $\overline{AG}$, and $\overline{AC}$ define radii of unit 1.0.

For the first bevel, triangle $\overline{ABC}$ is an isosceles right triangle. Therefore, AB is equal to $\sqrt{2}$ times the radius. Therefore $\overline{DB}$ is equal to $\sqrt{2}-1$.

$$\overline{BE} = \frac{\overline{DB}}{\cos(45°)} = 0.58.$$

For the second bevel, $\overline{AG}$ is equal to the radius and bisects angle $\overline{BAC}$. Angle $\overline{GAC}$ is 22.5°. Therefore $\overline{IC}$=tangent (22.5°)=0.414, $\overline{IG}=$ $$\frac{1}{\text{cosine}(22.5°)} - 1 = 0.082, \overline{IH} = \frac{\overline{IG}}{\text{cosine}(67.5°)} = 0.215,$$

and $\overline{EH}=\overline{EC}-\overline{IC}+\overline{IH}=0.22$.

The first outside bevel side is equal to (the expected outside radius of curvature+mask process bias)×0.58. The second outside bevel side is equal to (the expected outside radius of curvature+mask process bias )×0.22. The first inside bevel side is equal to (the expected inside radius of curvature+mask process bias )×0.58. The second inside bevel side is equal to (the expected inside radius of curvature−mask process bias)×0.22.

Figure 5:
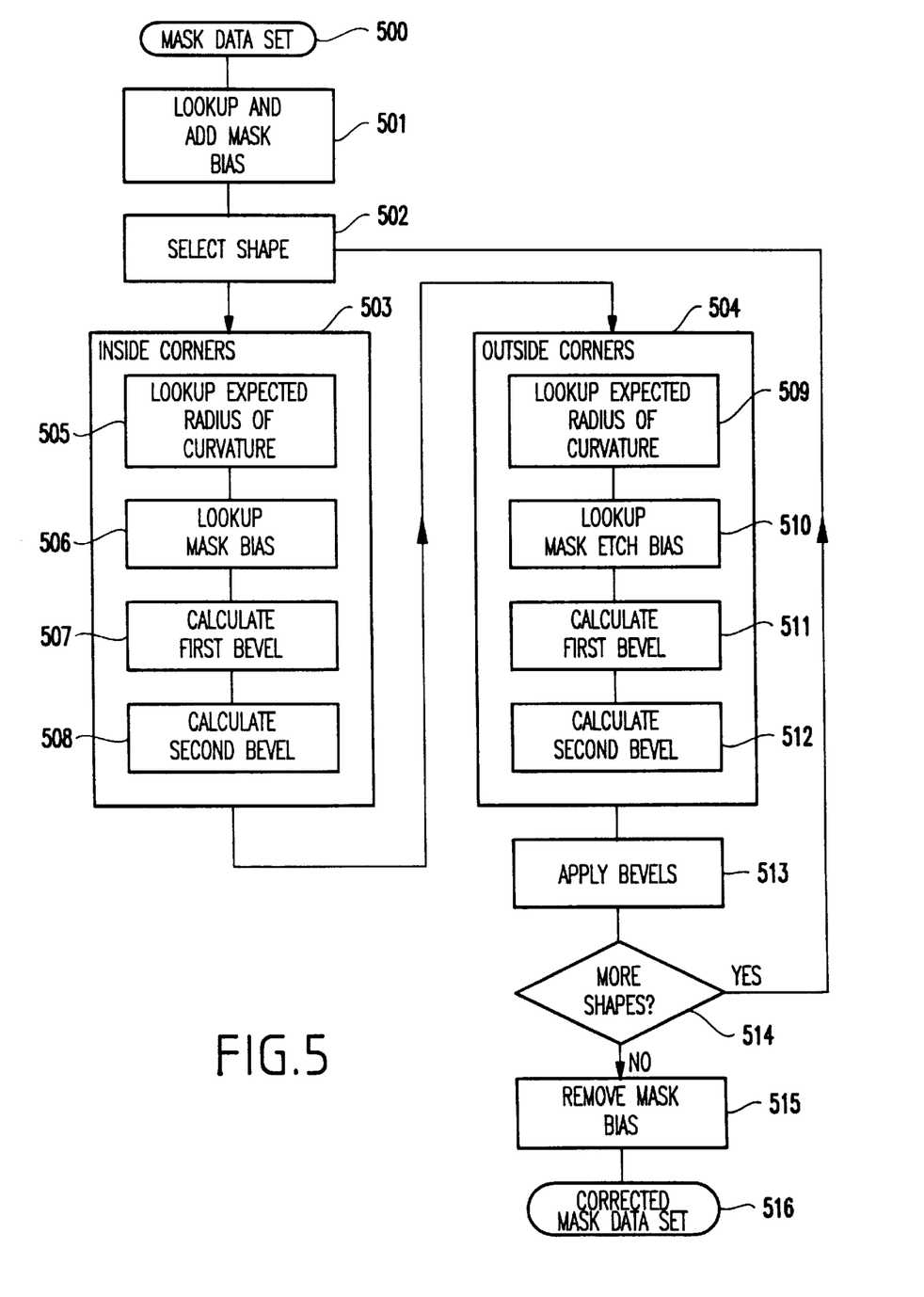
FIG. 5 is a flowchart of isolated corner images illustrating a preferred method of the invention.

FIG. 5 is a flowchart of the shapes adjustment rules of the invention for isolated corner images. The input is a mask data set 500 of shapes. The mask process bias 501 (which is empirically determined depending upon the etching process, such as wet etching or dry etching, used to form the mask) is looked up and added and a shape is selected 502. Then, the amount of adjustment of inside corners 503 is determined, and the amount of adjustment of outside corners 504 is determined. Next the adjustment is applied to the shape 513.

The order in which these adjustments are determined and applied can be varied without affecting the invention. If more shapes 514 are to be corrected the process is repeated for each shape. The last step is to subtract back the mask process bias 515 and the result is a corrected mask data set 516.

The adjustment sub-process for inside corners 503 comprises looking up the expected radius of curvature 505 for that shape based on measurements for that technology, level, and mask process; looking up the mask process bias 506 for that technology, level, and mask process; calculating the first bevel 507 and calculating the second bevel 508 according to the formula described above.

The adjustment sub-process for outside corners 504 comprises looking up the expected radius of curvature 509 for that shape based on measurements for that technology, level, and mask process; looking up the mask etch bias 510 for that technology, level, and mask process; calculating the first bevel 511 and calculating the second bevel 512 according to the formula described above.

Figure 6:
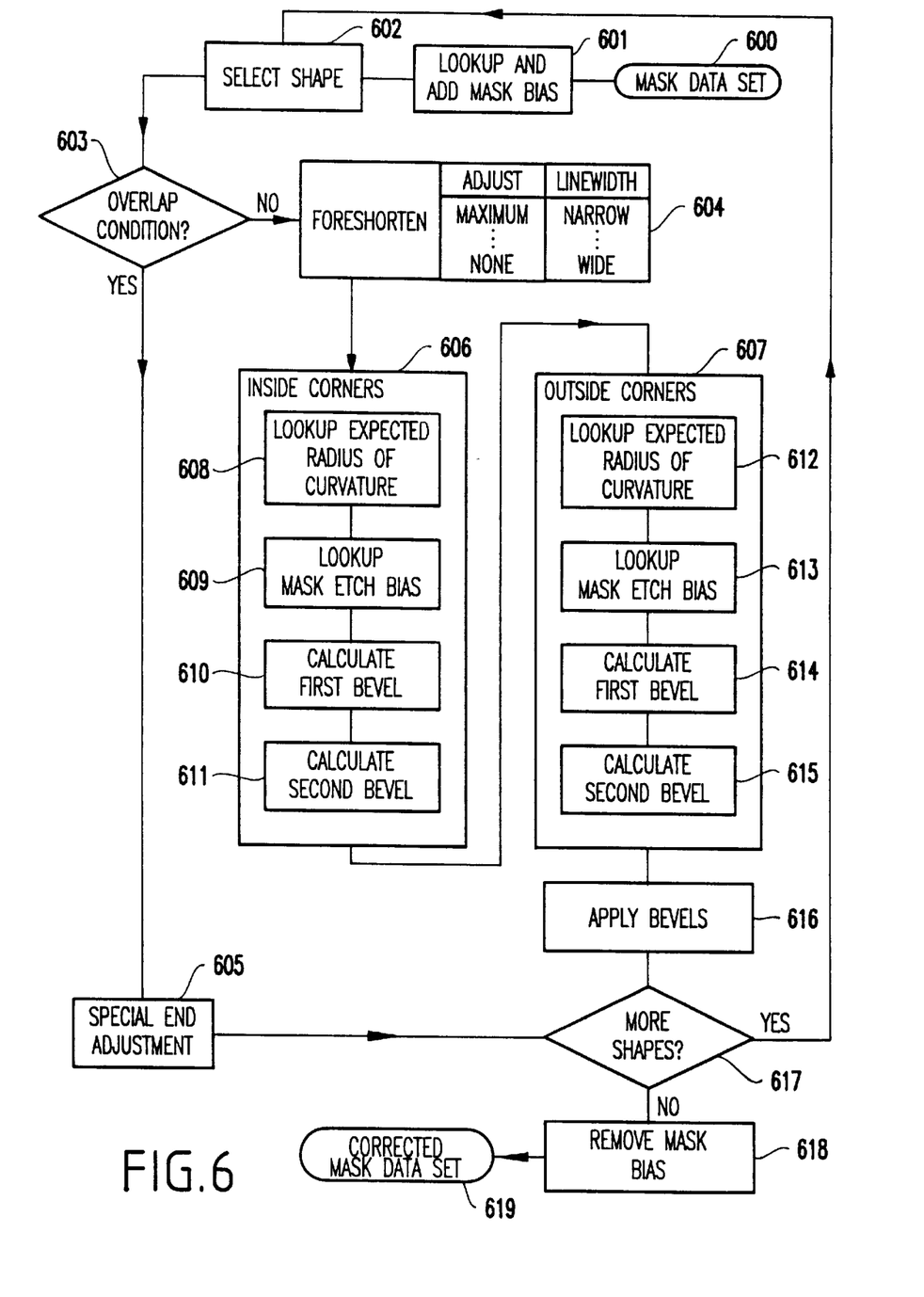
FIG. 6 is a flowchart for narrow lines illustrating a preferred method of the invention.

FIG. 6 is a flowchart of the shapes adjustment rules of the invention for narrow lines. The input is a mask data set of shapes 600. The mask process bias 601 is added and a shape is selected 602. Next a determination is made of whether or not the shape is sufficiently narrow so that circles corresponding to the radius of curvature on neighboring inside or outside corners overlap 603.

Figure 8:
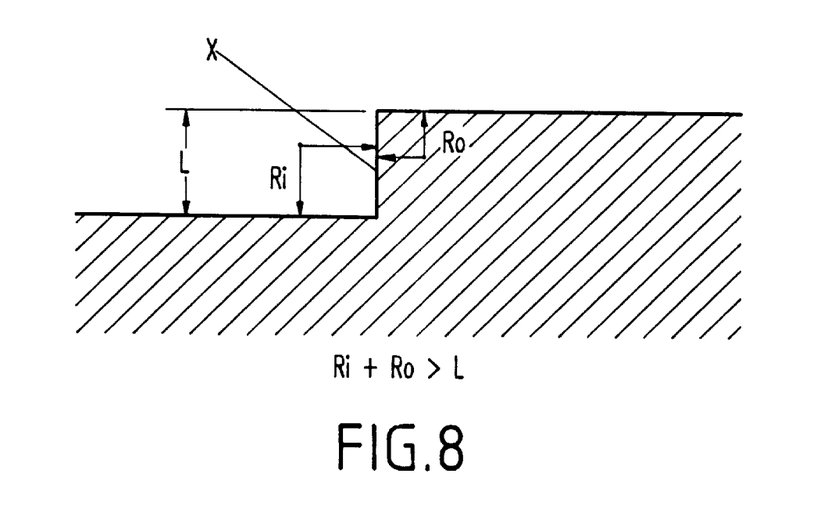
FIG. 8 is a schematic illustration of an inside corner and outside corner having overlapping radii of curvature.
Figure 9:
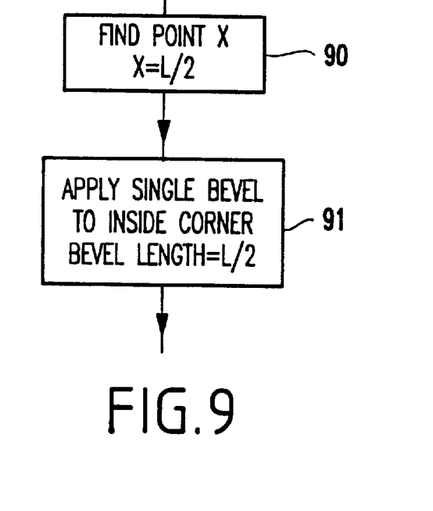
FIG. 9 is a flowchart for an inside corner and outside corner having overlapping radii of curvature illustrating a preferred method of the invention.

If an overlap condition is present, processing proceeds to the special end adjustment process 605, described in detail below with respect to FIGS. 7–9. If an overlap condition is not present, the foreshortening and corner beveling process 604 shown in FIGS. 4 and 5 is utilized.

Figure 7:
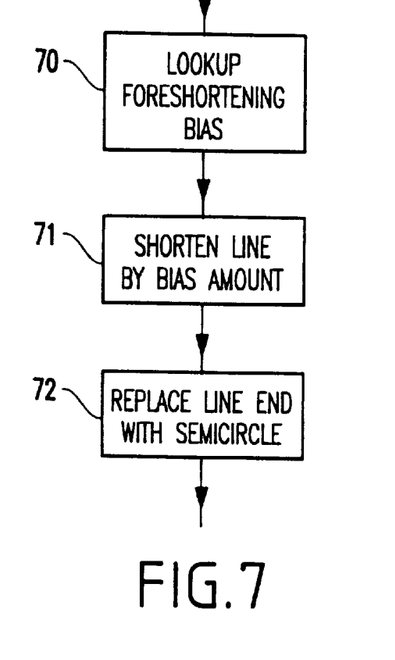
FIG. 7 is a flowchart for narrow lines illustrating a preferred method of the invention.

In the special end adjustment process 605, narrow lines which have radii of curvature which overlap are treated as shown in FIG. 7. The lines are foreshortened 71 by an amount 70 which depends on the line width and manufacturing process and is determined empirically. The line end is replaced with a semicircle 72. If an inside corner and an outside corner are sufficiently close so that their radii of curvature (e.g.,Ri, Ro) overlap, as shown in FIG. 8, the point "x" it is chosen to be one half of the separation (e.g., L/2) of the inner and outer corners. Then, as shown in FIG. 9 after the point "x" has been determined 90, a single bevel is applied to the inside corner where the bevel length is equal to L/2, 91.

For narrow lines which do not have radii of curvature that overlap, the width of the line is used to look up an appropriate foreshortening bias 604(which, again, it is determined empirically for each mask level and mask manufacturing process) which varies from a "maximum" value to "none" depending on the width of the line. Then the line is shortened by the appropriate bias amount. Referring again to FIG. 6, after the foreshortening process, for inside corners 606 the process includes looking up the expected radius of curvature 608 for that shape based on measurements for that technology, level, and wafer process; looking up the mask etch bias 609 for that technology, level, and mask process; calculating the first bevel 610 and calculating the second bevel 611 according to the formula described above.

After the foreshortening process, for outside corners 607 the process includes looking up the expected radius of curvature 612 for that shape based on measurements for that technology, level, and mask process; looking up the mask etch bias 613 for that technology, level, and mask process; calculating the first bevel 614 and calculating the second bevel 615 according to the formula described above.

Next the adjustment is applied to the shape 616. If more shapes 617 are to be corrected the process is repeated. The last step is to subtract back the mask process bias 618 and the result is a corrected mask data set 619.

As described above, the constantly decreasing features size in semiconductor technology requires increasing sophistication in the pre-production modeling of semiconductor features. The invention produces models which are more accurate than conventional modeling processes and also checks the highly accurate models according to different potential manufacturing qualities. Therefore, the inventive method is much more accurate in predicting potential errors (such as spacing errors) in semiconductor devices than conventional systems.

The invention produces designs which have higher yields and lower manufacturing costs by reducing design sensitivities to known manufacturing process variations. The invention is also applicable to any CAD-based design process wherein the manufacturing process variations can be modeled and the results analyzed via a set of design rules.

Further, the invention allows the designer to explore possible advantageous process variations that fall within the design rules. For example, a process variation may produced an unexpected benefits which would not have been inherently obvious from the initial unmodified design. The invention allows an unlimited number of process variations to be explored which allows the designer the opportunity to find any such unexpected benefits.

While the invention has been described in terms of preferred embodiments, those skilled in the art will recognize that the invention can be practiced with modification within the spirit and scope of the appended claims. For example, while the invention has been discussed above with respect to spacing violation rules, the invention can be also be utilized for other design checks, such as checking intersection area, common rule lengths, overlapping and other features which are commonly managed with the design rules.

What is claimed is:

1. A method for checking integrated circuit designs for design rule violations comprising:
    generating an ideal simulated image based on said semiconductor designs;
    altering said ideal simulated image to include potential manufacturing variations, thereby producing at least two simulated production images representing different manufacturing qualities; and
    comparing said simulated production images to design rules to produce an error list.

2. The method in claim 1, wherein two of said production images represent opposite manufacturing quality extremes.

3. The method in claim 1, wherein said production images illustrate a continuum of said potential manufacturing variations of said ideal image.

4. The method in claim 1, wherein said altering of said ideal images includes accounting for mask variations and optical variations.

5. The method in claim 1, wherein said production images include sets of production images, each set representing a different manufacturing variation, said comparing including:
    comparing one or more of said production images within each given set to said design rules; and
    comparing one or more of said sets of production images to said design rules.

6. The method in claim 1, wherein said potential manufacturing variations include one or more of focus variations, exposure variations, deposition variations, etching variations, and alignment variations.

7. The method in claim 1, wherein said design rules check one or more of spacing, intersection area, common run lengths and overlapping.

8. A method of designing an integrated circuit comprising:
    referring to a design manual to prepare design data sets;
    applying optical correction rules to said design data sets;
    applying shapes adjustment rules to set design data sets;
    applying process window variations to set design data sets;
    comparing said design data sets, modified by said applying processes, to design rules; and
    producing an error list for ones of said design data sets which violate said design rules.

9. The method in claim 8, wherein said applying of said process window variations produces at least two production images representing opposite manufacturing quality extremes.

10. The method in claim 8, wherein said applying of said process window variations produces at least two production images illustrating a continuum of potential manufacturing variations of said design data sets.

11. The method in claim 8, wherein said applying of said shapes adjustment rules includes accounting for mask variations.

12. The method in claim 8, wherein said applying of said process window variations produces at least two sets of production images, each set of production images representing a different manufacturing variation, said comparing including:
    comparing one or more of said production images within each given set of production images to said design rules; and
    comparing one or more of said sets of production images to said design rules.

13. The method in claim 8, wherein said process window variations include one or more of focus variations, exposure variations, deposition variations, etching variations, and alignment variations.

14. The method in claim 8, wherein said design rules check one or more of spacing, intersection area, common run lengths and overlapping.

15. A program storage device readable by machine, tangibly embodying a program of instructions executable by the machine to perform a method for checking integrated circuit designs for design rule violations, said method comprising:
    generating an ideal simulated image based on said semiconductor designs;
    altering said ideal simulated image to include potential manufacturing variations, thereby producing at least two simulated production images representing different manufacturing qualities; and
    comparing said production images to design rules to produce an error list.

16. The program storage device in claim 15, wherein two of said production images represent opposite manufacturing quality extremes.

17. The program storage device in claim 15, wherein said production images illustrate a continuum of said potential manufacturing variations of said ideal image.

18. The program storage device in claim 15, wherein said altering of said ideal images includes accounting for mask variations and optical variations.

19. The program storage device in claim 15, wherein said production images include sets of production images, each set representing a different manufacturing variation, said comparing including:
    comparing one or more of said production images within each given set to said design rules; and
    comparing one or more of said sets of production images to said design rules.

20. The program storage device in claim 15, wherein said potential manufacturing variations include one or more of focus variations, exposure variations, deposition variations, etching variations, and alignment variations.

21. The program storage device in claim 15, wherein said design rules check one or more of spacing, intersection area, common run lengths and overlapping.

22. A computer system comprising at least one central processing unit, at least one input device, at least one output device and at least one storage device, said storage device tangibly embodying a program of instructions executable by the central processing unit to perform a method for checking integrated circuit designs for design rule violations, said method comprising:

generating an ideal simulated image based on said semiconductor designs;

altering said ideal simulated image to include potential manufacturing variations, thereby producing at least two simulated production images representing different manufacturing qualities; and comparing said production images to design rules to produce an error list.

23. The computer system in claim 22, wherein two of said production images represent opposite manufacturing quality extremes.

24. The computer system in claim 22, wherein said production images illustrate a continuum of said potential manufacturing variations of said ideal image.

25. The computer system in claim 22, wherein said altering of said ideal images includes accounting for mask variations and optical variations.

* * * * *